United States Patent [19]

Kojima et al.

[11] 4,203,779

[45] May 20, 1980

[54] FLAME DETECTION THERMOCOUPLE

[75] Inventors: Tadashi Kojima; Kazuo Seki, both of Fujisawa, Japan

[73] Assignee: Honeywell Inc., Minneapolis, Minn.

[21] Appl. No.: 963,632

[22] Filed: Nov. 24, 1978

[51] Int. Cl.² .................... H01L 35/02; H01L 35/28
[52] U.S. Cl. .................... 136/233; 136/217; 136/230; 136/241; 136/242; 137/66; 431/80
[58] Field of Search ............ 136/217, 230, 233, 241, 136/242; 137/66; 431/80

[56] References Cited

U.S. PATENT DOCUMENTS 3,930,891   1/1976   Fox et al. ........................ 136/217

FOREIGN PATENT DOCUMENTS 872001   7/1961   United Kingdom .................... 136/241

Primary Examiner—Leland A. Sebastian
Attorney, Agent, or Firm—Clyde C. Blinn; Henry L. Hanson

[57] ABSTRACT

A flame detecting thermocouple for use with a gas valve to insure that the pilot flame exists before the gas valve can turn on the main burner. The thermocouple has a first rod shaped element which is composed of a high potential side thermoelectric material such as Chromel, Inconel, iron-chromium alloy and a second rod shaped element composed of a low potential side thermoelectric material formed of a 0.7 to 2% yttrium, 45–70% copper and the remainder of the alloy is nickel, and the elements are welded together at their ends to provide a junction which can be heated by a flame to produce a thermoelectric output at the other ends of the element.

4 Claims, 7 Drawing Figures

FLAME DETECTION THERMOCOUPLE

BACKGROUND OF THE INVENTION

1. Field of the Invention: The invention relates to a flame detecting thermocouple which can detect an established flame and deliver an electric signal. The flame detecting thermocouple makes use of two dissimilar metallic elements which have their ends welded together and the elements are connected to conductors properly insulated to deliver an electric signal as the voltage is developed across the conductors to control the operation of a gas valve such as disclosed in the Paul Dietiker U.S. Pat. No. 3,877,475 issued Apr. 15, 1975.

2. Description of the Prior Art: Flame detecting thermocouples are broadly old and have been used to prove the pilot flame of gas burners for many years. As the thermocouples are used in gas furnace control systems, a number of rigid requirements must be met. Obviously, the thermoelectromotive force or voltage developed must be sufficient to maintain the control device in an energized position when there is the presence of a flame. The response time to develop the voltage upon an initial startup must be sufficiently low to insure that the voltage is developed without requiring a manual actuator to be held in for too long a period of time. The heat resistance properties of the thermocouple must be sufficient to withstand many hours at a high temperature. The anti-corrosive properties of the thermocouple which operates in a high temperature oxidizing atmosphere containing gases and sulfur must be sufficient to provide a thermocouple which operates under these conditions for a considerable period of time. The thermocouple must be easily manufactured to maintain a good workable thermocouple at a low cost so the manufacturer can produce the thermocouple and yet market it to the ultimate consumer at a reasonable price in a very competitive market.

Many prior art thermocouples use an iron alloy for one element and a copper alloy such as Constantan or Copel as a second element and the elements are welded together to provide the electromotive output.

SUMMARY OF THE INVENTION

The present invention is concerned with a flame detecting thermocouple which has a first element composed of a high potential side thermoelectric material formed of Chromel, Inconel or iron-chromium alloy or the like, and a second element formed of an alloy of 0.7 to 2% yttrium, 45 to 70% copper and the remainder nickel. The front end of these first and second elements are joined by welding or soldering. In general, the elements are coated with a layer of non-oxidizing material to protect their surfaces when the thermocouple is exposed to a highly oxidizing and sulfur containing atmosphere at a high temperature for a long period of time.

DESCRIPTION OF THE PREFERRED EMBODIMENT

Figure 1:
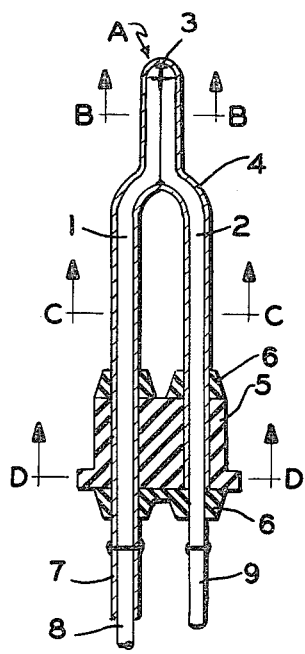
FIG. 1A is a longitudinal sectional view of one embodiment of the thermocouple of the present invention, FIGS. 1B, C and D are cross-sectional views taken along the lines shown in FIG. 1A.

Referring to FIG. 1A, a flame detecting thermocouple has a first element 1 which is composed of a high potential side thermoelectric material formed of Chromel, Inconel, iron-chromium alloy or the like, and an element 2 which is composed of an alloy formed of 0.7 to 2% yttrium, 45–70% copper and the remainder of the element is nickel. Elements 1 and 2 are of any configuration, and in the preferred embodiment they are circular in cross-section and rod shaped. Elements 1 and 2 are spaced apart from each other and arranged in parallel with each other. The front ends of the two elements are bent such that the two elements are in contact with each other for a given length shown by the cross-section view of FIG. 1B. The front end of elements 1 and 2 are joined by welding or soldering to form a junction 3. A cover 4 or surface coating on elements 1 and 2 such as an aluminum layer is made by dipping treatment for the purpose of protecting the surfaces of the elements. Elements 1 and 2 are provided at their free ends with a supporting member 5 formed of ceramic or heat resistant synthetic resin. The supporting member 5 may be made integral with the elements 1 and 2 by molding the ceramic or synthetic resin and then subjecting the member to a sintering or hardening treatment. The supporting member may be provided with a pair of guide holes beforehand through which the first and second elements are extended in order to hermetically seal the bonded portions between the supporting element 5 and the elements 1 and 2 with a further seal 6. The synthetic resin of the supporting member is preferably an age hardening resin or polyphenylene sulfide resin such as that available on the commercial market by the trade name "Riton" manufactured by U.S. Philips Company. This resin used for support member 5 can withstand a temperature of 260°C. or higher and hence has a heat resistance property which is sufficient for the supporting member 5 of the thermocouple elements 1 and 2.

The free end of element 1 is connected to a lead wire 8 which has an insulating layer 7 and the free end of element 2 is connected to a lead wire 9.

DESCRIPTION OF THE OTHER EMBODIMENTS

Figure 2:
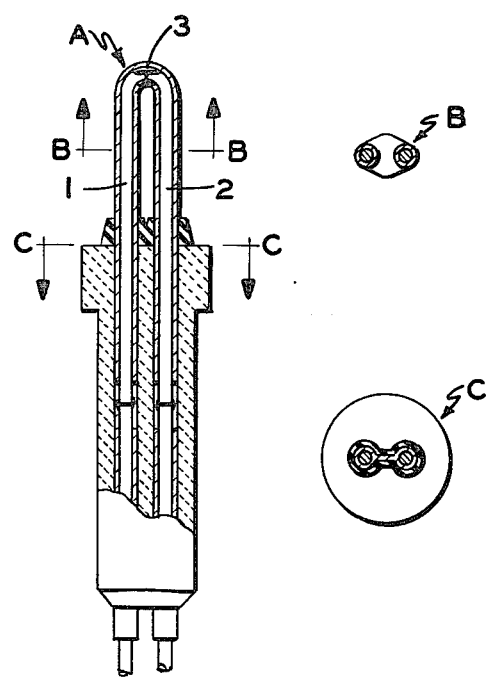
FIG. 2A is another embodiment of the thermocouple, FIGS. 2B and C are cross-sectional views taken along the lines shown in FIG. 2A.

Referring to FIG. 2, another embodiment of the invention is shown where elements 1 and 2 are bent and the front ends are butted together to provide the welded or soldered joint to form junction 3. The cross-sectional views of the elements of FIG. 2A are shown in FIGS. 2B and C.

Figure 3:
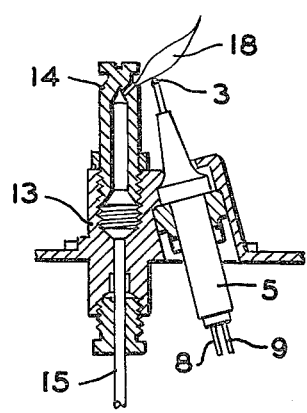
FIG. 3A is another embodiment of the present invention with a schematic showing of how the conductors of the thermocouple are connected to remote terminals, FIGS. 3B, C and D are cross-sectional views of the FIG. 3A.

A further embodiment of the present invention is shown in FIG. 3A wherein the elements 1 and 2 are arranged in parallel with each other for a given length and each formed into a semicircular cross-section as shown in FIG. 3B. Elements 1 and 2 are connected to the conductors 8 and 9 which are shown terminating at conventional terminals which are used with associated gas control devices as mentioned in the Paul Dietiker Pat. No. 3,877,475.

OPERATION OF THE PRESENT INVENTION

Figure 4:
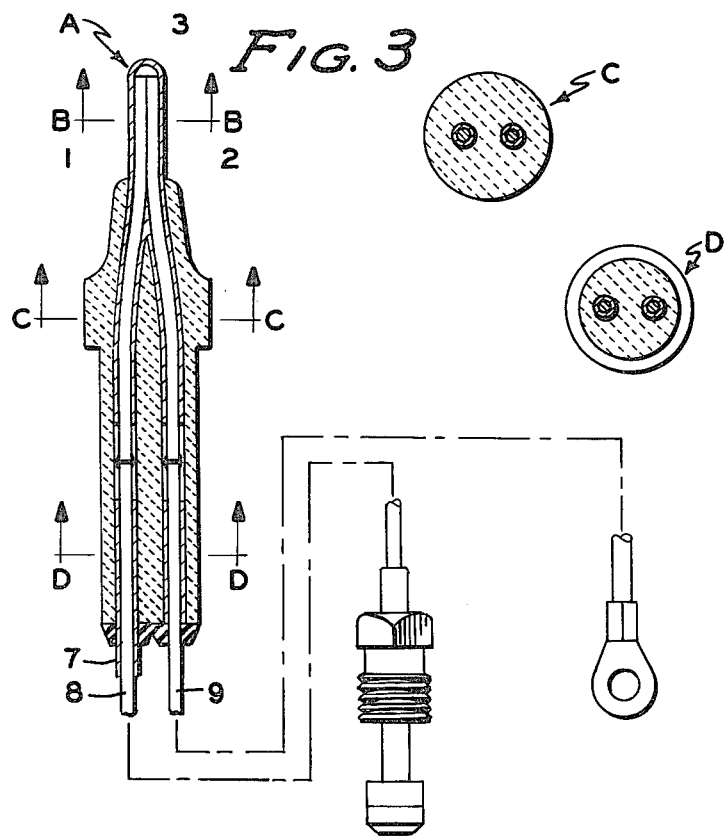
FIG. 4 is a sectional view showing the thermocouple shown in FIG. 3A and incorporated into a pilot burner having the pilot flame impinging upon the end of the thermocouple.

The preferred embodiment of the thermocouple as shown in FIG. 1A, having elements 1 and 2 welded at the junction 3 is used in a pilot burner as shown in FIG. 4, having a bushing 13 and a nozzle 14 to which a gas supply is furnished through a tube 15 to provide a pilot flame 18 to impinge upon the thermocouple junction 3. The location of this pilot burner is generally quite close to the main burner and the ambient temperature is quite high. Additionally, the thermocouple is exposed to the corrosive action of a highly oxidizing atmosphere containing sulfur which in the high temperature condition results in corrosion of the thermocouple.

Figure 5:
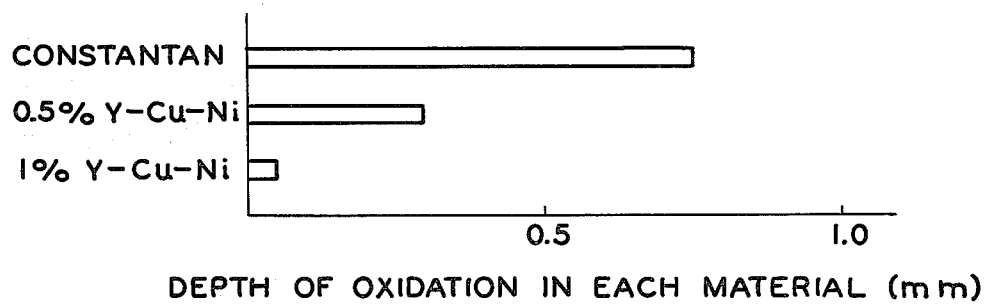
FIG. 5 is a graph showing the relation between the anti-corrosive property of the thermocouple material for use in the present invention and that of Constantan.

Referring to FIG. 5, a graphical representation of the depth of oxidation in each material in millimeters is shown for the different materials that are used for the thermocouple when the thermocouple is placed in a flame at a temperature of 800° C. for 500 hours to show a comparison with the material of the present invention as compared to that when the surface is Constantan. As shown, the Y-Cu-Ni alloy is sufficiently better in the anti-corrosive property than that of the conventional Constantan prior art type of metal used in thermocouples.

Figure 6:
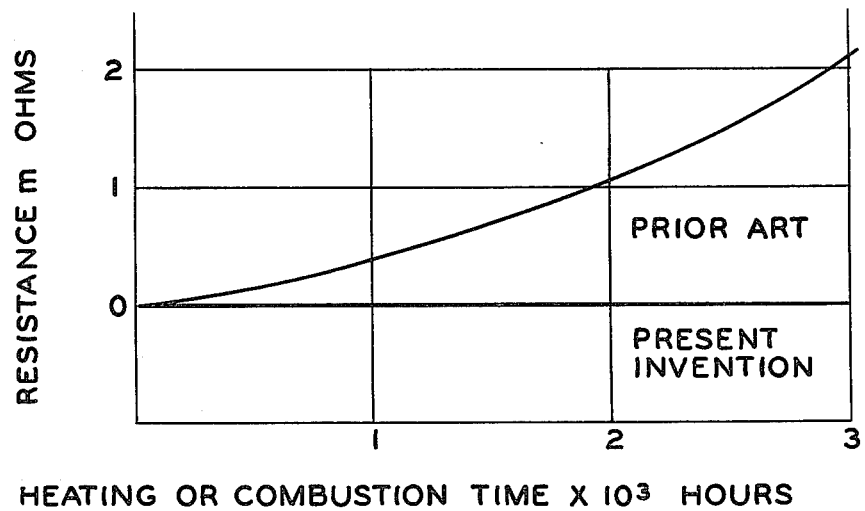
FIG. 6 is a graph showing the relation between the change in resistance value of the thermocouple according to the invention and that of the conventional thermocouple.

FIG. 6 has a graphical representation of the change in resistance value in milli-ohms across the terminals of the thermocouple with the increased heating time in hours of the thermocouple at a temperature of 800° C. to compare the resistance value with that of prior art thermocouples. The deterioration of metal of the thermocouple is exhibited by an increase in the electrical resistance across the terminal and with the present invention a superior resistance to deterioration at the high temperature is shown in the thermocouple using the Y-Cu-Ni alloy.

Figure 7:
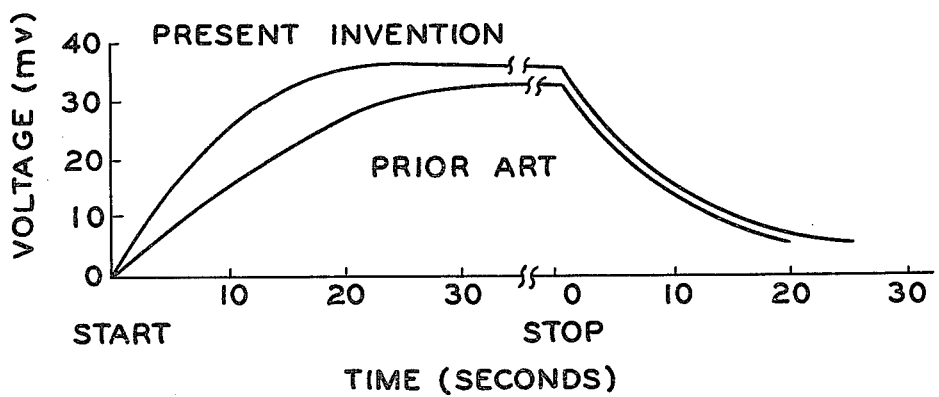
FIG. 7 is a graph showing the relation between the raising-up and lowering-down properties of the thermocouple according to the invention and those of conventional thermocouples.

FIG. 7 is a graphical representation of the rising-up and lowering-down characteristics of the thermoelectromotive force or milli-volts of the thermocouple in comparison to conventional thermocouples. The rising-up characteristic of the thermoelectromotive force of the thermocouple can be defined by the time in seconds from start or the time from stop. This increase and decrease in output is very important in an electromagnetic device of a gas safety valve as it is significant in that the operator is required to push a knob and hold the electromagnetic device in for a sufficient time to have the electromagnetic device energized, as disclosed in the mentioned Paul Dietiker patent. The lowering-down or dropping-out characteristic is quite important in that it shortens the time in which the electromagnetic device will drop off to provide for safety to extinguish the gas control to the furnace.

The present invention making use of the alloy yttrium, copper and nickel provides for a superior thermocouple which has many of the following characteristics:

the thermoelectromotive force or voltage output of the thermocouple is larger than conventional thermocouples, the response time, i.e. the time in which an output is available or the output drops to zero is much higher than conventional thermocouples, the heat resistance properties of the thermocouple are superior to the prior art which is quite important when the thermocouple is to operate in high temperature ambient conditions, the anti-corrosive properties in an oxidizing atmosphere where there is a reduction atmosphere and a sulfur containing atmosphere is better than prior art thermocouples, the thermocouple of this invention has good workability characteristics in that the metals are such that welding and manufacture are highly desirable, and the thermocouple of the present invention is believed to provide a less expensive thermocouple to meet the needs of the commercial market.

The embodiments of the invention in which an exclusive property or right is claimed are defined as follows:

1. A flame detecting thermocouple comprising
   a first element which is composed of a high potential side thermoelectric material of an iron-chromium alloy,
   a second element composed of a low potential side thermoelectric material formed of an alloy of 0.7 to 2% of yttrium, 45–70% copper and the remainder of the alloy is nickel, and
   a welded connection of the ends of said first and second elements to provide a junction which can be heated by a flame to produce a thermoelectric output at the other ends of the elements.

2. The flame detecting thermocouple of claim 1 wherein,
   said first and second elements and said junctions are coated with an aluminum layer.

3. The flame detecting thermocouple of claim 1 comprising,
   a support means for said first and second elements to support their free ends,
   said support means comprising an age hardening resin.

4. The flame detecting thermocouple of claim 1 wherein,
   said junction is formed by welding the front ends of said first and second elements.

* * * * *